United States Patent
Eklund

(10) Patent No.: US 8,053,835 B1
(45) Date of Patent: Nov. 8, 2011

(54) LATERAL SEMICONDUCTOR DEVICE COMPRISING TWO LAYERS OF MUTUALLY OPPOSITE CONDUCTIVITY-TYPE MATERIALS BETWEEN SOURCE AND DRAIN

(76) Inventor: Klas-Hakan Eklund, Sollentuna (SE)

( * ) Notice: Subject to any disclaimer, the term of this patent is extended or adjusted under 35 U.S.C. 154(b) by 0 days.

(21) Appl. No.: 09/959,744

(22) PCT Filed: May 3, 2000

(86) PCT No.: PCT/SE00/00854
§ 371 (c)(1),
(2), (4) Date: Nov. 5, 2001

(87) PCT Pub. No.: WO00/67329
PCT Pub. Date: Nov. 9, 2000

(30) Foreign Application Priority Data

May 3, 1999 (SE) ........................................ 9901575

(51) Int. Cl.
*H01L 29/78* (2006.01)

(52) U.S. Cl. ......... 257/343; 257/E29.066; 257/E29.261; 257/E21.417

(58) Field of Classification Search .............. 257/141, 257/197, 139, 328, 339, 1, 345, 378, 423, 257/526, 552, 492, 493, 343, 273, 335, 336, 257/337, 338, 340, 341, 342, 344, 347, 350, 257/E21.382, E21.417, E29.066, E29.175, 257/E29.187, E29.197, E29.256, E29.261, 257/E29.265, 409; 438/234, 1, 236, 309, 438/316, 325, 370
See application file for complete search history.

(56) References Cited

U.S. PATENT DOCUMENTS

| | | | | |
|---|---|---|---|---|
| 5,059,547 A * | 10/1991 | Shirai | ........................... | 438/295 |
| 5,146,298 A * | 9/1992 | Eklund | ........................ | 257/378 |
| 5,241,210 A * | 8/1993 | Nakagawa et al. | ........... | 257/487 |
| 5,313,082 A * | 5/1994 | Eklund | ........................ | 257/262 |
| 5,382,818 A * | 1/1995 | Pein | ............................... | 257/347 |
| 5,654,561 A * | 8/1997 | Watabe | ........................ | 257/139 |
| 5,710,444 A * | 1/1998 | Neubrand et al. | ............ | 257/141 |
| 5,731,603 A * | 3/1998 | Nakagawa et al. | ........... | 257/141 |
| 5,796,125 A * | 8/1998 | Matsudai et al. | ............. | 257/343 |

(Continued)

FOREIGN PATENT DOCUMENTS

DE        31 03 785        12/1981

(Continued)

OTHER PUBLICATIONS

"Performance Innovative Trends in RESURF Technology," by Adrian W. Ludikhuize, Philips Research, Eindhoven, The Netherlands, 2001.

*Primary Examiner* — Samuel Gebremariam
*Assistant Examiner* — Andrew O. Arena
(74) *Attorney, Agent, or Firm* — Alfred J. Mangels

(57) ABSTRACT

A semiconductor element includes an insulating outer layer that includes electric contact connections of a first conductive type. These connections are connected to contact areas located beneath the insulating surface layer, of which connections at least one is of a first conductive type. At least one of the contact areas and a further area that includes two layers of mutually different conductive types disposed between the contact areas, are covered by a layer of a second conductive type of material. This second layer is, in turn, covered with an insulating layer on at least that side which lies distal from the surface layer.

19 Claims, 2 Drawing Sheets

U.S. PATENT DOCUMENTS

| | | | | |
|---|---|---|---|---|
| 5,874,768 | A | * | 2/1999 | Yamaguchi et al. ........... 257/339 |
| 5,886,384 | A | * | 3/1999 | Soderbarg et al. ............ 257/347 |
| 5,898,201 | A | * | 4/1999 | Hsu et al. ...................... 257/409 |
| 5,943,579 | A | * | 8/1999 | Tran .............................. 438/370 |
| 6,069,396 | A | * | 5/2000 | Funaki ........................... 257/341 |
| 6,191,453 | B1 | * | 2/2001 | Petruzzello et al. .......... 257/378 |
| 6,198,130 | B1 | * | 3/2001 | Nobuto et al. ................. 257/343 |
| 6,211,551 | B1 | * | 4/2001 | Suzumura et al. ............ 257/343 |
| 6,303,492 | B1 | * | 10/2001 | Rhodes et al. ................. 438/648 |
| 6,307,224 | B1 | * | 10/2001 | Shirai ............................ 257/288 |
| 6,380,566 | B1 | * | 4/2002 | Matsudai et al. .............. 257/175 |

FOREIGN PATENT DOCUMENTS

| | | | |
|---|---|---|---|
| EP | 0 550 015 | 7/1993 | |
| JP | 02-185067 | * 7/1990 | ..................... 29/784 |
| WO | WO 98/05076 | 2/1998 | |

* cited by examiner

LATERAL SEMICONDUCTOR DEVICE COMPRISING TWO LAYERS OF MUTUALLY OPPOSITE CONDUCTIVITY-TYPE MATERIALS BETWEEN SOURCE AND DRAIN

BACKGROUND OF THE INVENTION

The present invention relates to a semiconductor element and then particularly to an improved semiconductor element especially for use in a transistor.

U.S. Pat. No. 5,146,298, for example, teaches a semiconductor element, particularly a high-voltage MOS-transistor, that includes a substrate of a first conductive type on which there is mounted a layer of material of a second conductive type that includes cells which are comprised of material of a first conductive type in which the electrical contact areas, source area and gate area, are placed and also an electric contact area of a second conductive type, drain area. According to this prior publication, the first type of conductive material is normally p-type silicon doped with about $5 \times 10^{14}$ atoms per $cm^3$, whereas the second conductive material is n-type silicon doped with about $3 \times 10^{12}$ atoms per $cm^3$. A further area formed by two layers of the first and the second conductive types of material respectively is disposed between drain area and the other two contact areas. The substrate has a typical thickness of from 100 to 500 μm. An effective breakdown voltage of about 300 V is obtained with these dimensions and doping levels. The semiconductor element also includes an insulating outer layer through which the electric contacts extend.

The object of the present invention is to provide an improved semiconductor element of this type, in which the dimensions of said semiconductor element can be reduced substantially without detracting from its performance.

SUMMARY OF THE INVENTION

The object of the invention is achieved with a semiconductor element in which the layer of said second conductive material is covered with an insulating layer on its side that lies distal from the surface layer.

By providing an insulating layer on the opposite side of the second conductive type of material in relation to the insulating surface layer, the layer of second conductive type material can be made thinner, in the order of magnitude of 1 μm or less, as distinct to present-day thicknesses of 4-5 μm. This enables the charge carrier concentration, doping, to be increased from about $10^{15}$ to about $10^{17}$.

The breakdown voltage is determined by the area that has the lowest critical field. In the case of the prior publication, the p-area doped with $5 \times 10^{14}$ atoms per $cm^3$ has a critical field of about 20V/μm, which is the determinant field. When the p-area is replaced with an insulating layer in accordance with the invention, the breakdown voltage will, instead, be determined by the doping and the critical field in the layer comprising said second type of conductive material surrounded by the insulating layer. According to the aforesaid prior patent publication, doping is about $5 \times 10^{15}$ and the critical field is 30V/μm. The aforesaid significant improvement is achieved when this layer is made thinner, now about 0.3 μm, while retaining a total charge of $3 \times 10^{12}/cm^2$. Doping is thus increased to $10^{17}$ and the critical field to 80V/μm. The transistor breakdown voltage is herewith increased, determined by the critical field, from ≈20V/μm to ≈80V/μm, i.e. an increase by a factor of 4. The distance between source area and drain area $L_D$, the operative distance, for a given voltage can be reduced to ¼ at the same time as the resistance of the active transistor, Ron, decreases to ¼. The quality factor, $R_{on}*A$ (the surface), will thereby be improved by a factor of 16.

In another embodiment of the invention, there is disposed between the insulating layer and the layer of said second conductive type of material a thin layer of a first conductive type of material, therewith enabling doping in the layer of said second conductive type of material to be further increased by a factor of 2.

According to further embodiments of the invention, an IGBT-transistor (Insulated Gate Polar Transistor) and also a bipolar transistor can be constructed in a corresponding fashion.

BRIEF DESCRIPTION OF THE DRAWINGS

The invention will now be described with reference to two non-limiting embodiments and with reference to the accompanying drawings, in which.

DETAILED DESCRIPTION OF THE PREFERRED EMBODIMENTS

Figure 1:
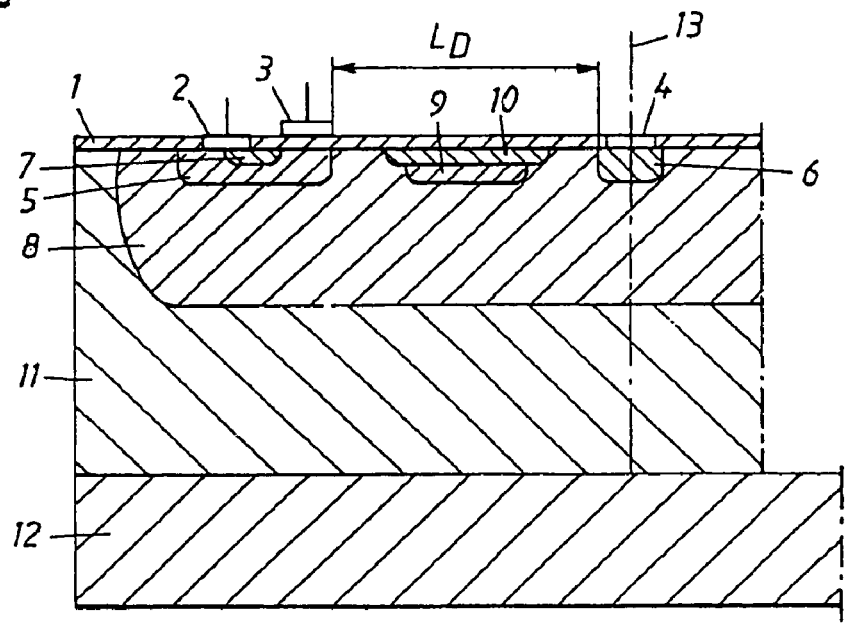
FIG. 1 is a schematic side sectioned view of a MOS-transistor in accordance with the invention.

FIG. 1 is a schematic sectioned side view of an inventive semiconductor element, a transistor. The transistor includes an insulating outer layer 1 which includes electric contact connectors. These connectors may be connectors for the source 2, gate 3 and drain 4 of the transistor. The electric contact connectors are connected to the contact areas 5, 6 located beneath the insulating surface layer 1. The contact area 5 includes connections to the source connectors and a part 7 enclosed therein, this part normally being referred to as the source area, whereas the contact area 6, referred to as the drain area, includes connections to the drain connectors.

The contact areas 5, 6 are overlaid with a layer 8 comprised of the second conductive type of material, normally an n-type material. The material is usually in the form of a thin silicon plate, Si. This layer or plate has a thickness in the order of 1 μm or less, and has a doping ratio of $10^{16}$ to $10^{11}$ atoms per $cm^3$.

The contact areas 5, 6 are overlaid with a layer 8 comprised of the second conductive type of material, normally an n-type material. The material is usually in the form of a thin silicon plate, Si. This layer or plate has a thickness in the order of 1 μm or less, and has a doping ratio of $10^{16}$ to $10^{17}$ atoms per $cm^3$.

A further area comprised of two layers 9, 10 of said first and said second conductive types of material, respectively, is disposed between the contact areas 5 and 6.

The layer 8 is overlaid with an insulating layer 11 on its side distal from the outer layer 1. The insulating layer 11 may suitably comprise silicon dioxide, $SiO_2$.

The insulating layer 11 and therewith the remaining parts of the inventive semiconductor element may be supported by a carrier, a substrate 12, e.g. a silicon substrate Si. Shown in the drawings is a symmetry line 13 on whose other side a second half of a transistor is located as a mirror image of the transistor shown on the left of the symmetry line as seen in the drawings. It will be understood that the contact area 6 including the transistor drain connector 4 is common to the two transistors of the semiconductor element.

As before mentioned, the use of an insulator 11 overlying the doped layer 8 comprised of a material of the second conductive type enables the doped layer to be made thinner, and therewith enables the distance between contact area 5 and drain area 6, the operative distance $L_D$ to be reduced to ¼. This enables the dimensions of the semiconductor element as a whole to be reduced in the order of 1:16. In addition to space benefits, these reductions in dimensions also benefit manufacturing costs, which are essentially directly proportional to size.

The circuit illustrated in FIG. 1 can also function as a bipolar transistor, with the area 7 functioning as an emitter, the area 5 functioning as a base, and the layer 8, the layer 10 and the area 6 functioning as an extended collector.

Figure 2:
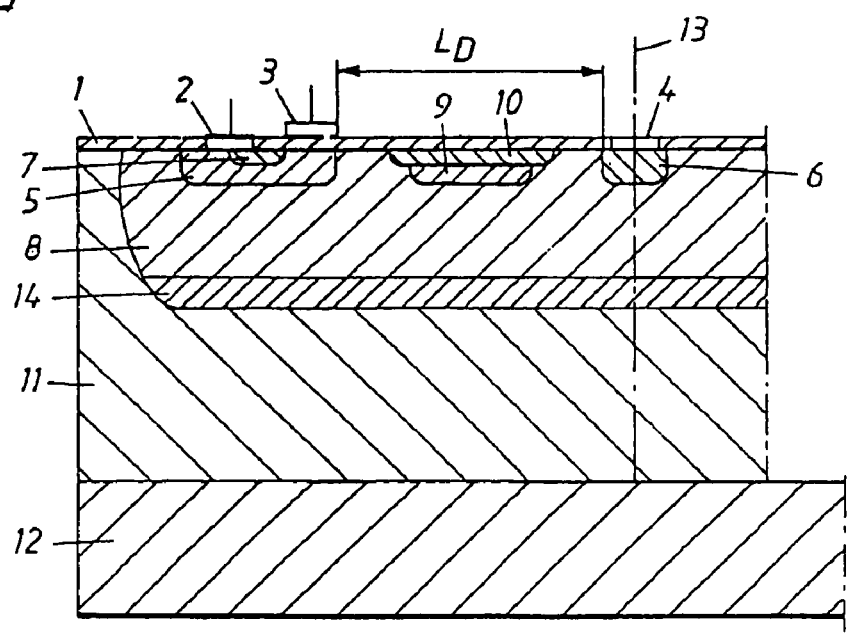
FIG. 2 is a corresponding view of another embodiment of the transistor shown in FIG. 1.

FIG. 2 illustrates another embodiment of an inventive semiconductor element, a transistor, in a view corresponding to the FIG. 1 illustration. This embodiment differs from the FIG. 1 embodiment solely by virtue of a further thin layer of material 14 disposed between the doped layer 8 of the second conductive type of material and the isolator, the insulating layer 11. This further thin layer 14 is comprised of the first type of conductive material, normally a p-type material, and, similar to the doped layer 8 of said second type of conductive material, is normally in the form of a thin silicon plate, Si.

The inclusion of the further thin layer 14 enables doping of the doped layer 8 of said second type of conductive material to be increased by a factor of 2. This enables the dimensions of the semiconductor element, and therewith the costs thereof, to be further reduced.

As with the first embodiment, the insulating layer 11 and therewith the remaining parts of the inventive semiconductive element may be supported by a carrier, a substrate 12, for instance a silicon (Si) substrate.

Figure 3:
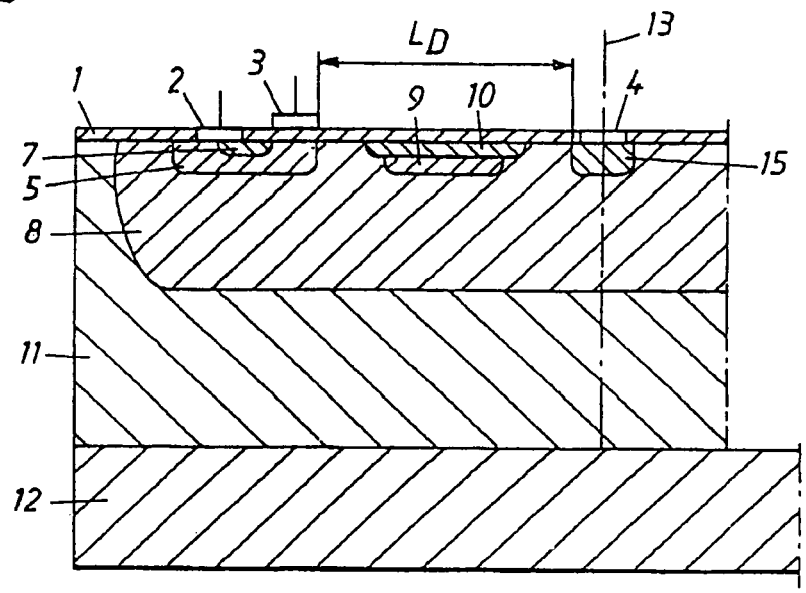
FIG. 3 is a schematic side sectioned view of an IGBT-transistor in accordance with the invention.

FIG. 3 illustrates another type of semiconductor element, in this case an IGBT-transistor, which has generally the same construction as the aforedescribed MOS-transistor illustrated in FIG. 1, although with the difference that the contact area 6 has been replaced by a contact area 15 comprised of a first is type of conductive material, normally a p-type.

Figure 4:
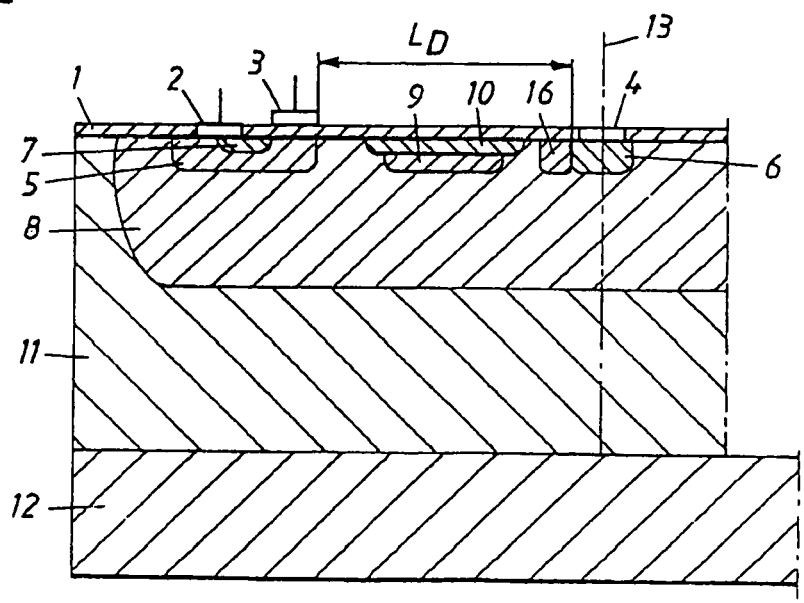
FIG. 4 is a corresponding view of another embodiment of the transistor shown in FIG. 3.

FIG. 4 illustrates a variant of an IGBT-transistor according to the invention that has the same construction as the MOS-transistor described above and illustrated in FIG. 1, although with the difference that the contact area 6 has been supplemented with a further area 16 that while being similar to the area 6 is comprised of a first type of conductive material, normally a p-type material. This further area 16 is joined by metal to the contact area 6, in the same way as the areas 5 and 7 are interconnected.

Similar to the embodiment shown in FIG. 2, the semiconductor elements according to FIGS. 3 and 4 may be provided with a further thin layer of material disposed between the doped layer 8 of said second conductive type of material and the isolator, the insulating layer 11.

Although the contact area 5 of the illustrated embodiments is covered by the layer 8, it will be understood that the contact area 5 may instead extend beyond the layer 8. However, the layer 8 must cover respective contact areas 6; 15; 6, 16, and the further contact area 9, 10.

Neither is it necessary for the insulating layer 11 to cover the layer 8, since it is sufficient for the insulating layer 11 to cover that side of the layer 8 which is distal from the surface layer 1.

It will be understood that the first and the second types of conductive materials in the inventive semiconductor element may exchange places in relation to what has been described above.

The invention claimed is:

1. A semiconductor element having reduced dimensions, said semiconductor element comprising:
    an insulating surface layer in which electric contact connections are provided,
    the connections being connected to respective first and second contact areas situated beneath the insulating surface layer and spaced from each other along an inwardly-facing surface of the insulating surface layer,
    wherein at least the first contact area is a first conductive type material and wherein the second contact area is a second conductive type material;
    a further area formed by two layers of mutually different conductive type materials disposed beneath the insulating surface layer,
    wherein the further area is positioned between and is spaced from each of the first and second contact areas;
    wherein an inwardly-facing surface of each of the first and second contact areas and an inwardly-facing surface of the further area include an overlying layer of the second conductive type material,
    wherein the overlying layer of the second conductive type material has a thickness of about 1 μm or less and has a doping concentration of $10^{16}$ to $10^{17}$ atoms per $cm^3$; and
    an inner silicon dioxide insulating layer on a side of the overlying layer distal from the surface layer,
    the inner silicon dioxide insulating layer being effective with the overlying layer of the second conductive type material having a thickness of about 1 μm or less to thereby provide an increase in doping concentration of the overlying layer of the second conductive type material and provide a reduced size semiconductor element.

2. A semiconductor element according to claim 1, wherein the silicon dioxide insulating layer is carried by a substrate.

3. A semiconductor element according to claim 1, wherein the further area is in contact with the inwardly-facing surface of the insulating surface layer.

4. A semiconductor element according to claim 1, wherein the first contact area is connected with a source electrode.

5. A semiconductor element according to claim 4, wherein the second contact area is connected with a drain electrode.

6. A semiconductor element in accordance with claim 1, wherein each of the two layers of mutually different conductive-type materials that form the further area is in contact with the overlying layer.

7. A semiconductor element in accordance with claim 1, wherein the inner silicon dioxide insulating layer contacts the insulating surface layer to enclose therebetween the overlying layer of the second conductive material.

8. A semiconductor element according to claim 1, wherein the semiconductor element has a critical field of about 80 V/μm and a breakdown voltage of about 300 volts.

9. A semiconductor element having reduced dimensions, said semiconductor element comprising:
    an insulating surface layer in which electric contact connections are provided,
    the connections being connected to respective first and second contact areas situated beneath the insulating surface layer and spaced from each other along an inwardly-facing surface of the insulating surface layer,
    wherein at least the first contact area is a first conductive type material and wherein the second contact area is a second conductive type material;
    a further area formed by two layers of mutually different conductive type materials disposed beneath the insulating surface layer,
    wherein the further area is positioned between and is spaced from each of the first and second contact areas;

wherein an inwardly-facing surface of each of the first and second contact areas and an inwardly-facing surface of the further area include an overlying layer of the second conductive type material having a thickness of about 1 µm or less and doping concentration of $10^{16}$ to $10^{17}$ atoms per cm$^3$;

an inner silicon dioxide insulating layer on at least a side of the overlying layer distal from the insulating surface layer, the inner silicon dioxide insulating layer being effective with the overlying layer of the second conductive type material having a thickness of about 1 µm or less to thereby provide an increase in doping concentration of the overlying layer of the second conductive type material and to provide a reduced size semiconductor element; and an additional layer of conductive material between the overlying layer of the second conductive type material and the inner silicon dioxide insulating layer, wherein the additional layer overlies the inwardly-facing surfaces of the first and second contact areas and the further area.

10. A semiconductor element according to claim 9, wherein the additional layer includes silicon and is of the first conductive type material.

11. A semiconductor element in accordance with claim 9, wherein each of the two layers of mutually different conductive-type materials that form the further area is in contact with the overlying layer.

12. A semiconductor element in accordance with claim 9, wherein the inner silicon dioxide insulating layer contacts the insulating surface layer to enclose therebetween the overlying layer of the second conductive material.

13. A semiconductor element according to claim 9, wherein the semiconductor element has a critical field of about 80 V/µm and a breakdown voltage of about 300 volts.

14. A semiconductor element having reduced dimensions, said semiconductor element comprising:

an insulating surface layer in which electric contact connections are provided, the connections being connected to respective first and second contact areas situated beneath the insulating surface layer and spaced from each other along an inwardly-facing surface of the insulating surface layer, wherein at least the first contact area is a first conductive type material and wherein the second contact area is a second conductive type material;

a further area formed by two layers of mutually different conductive type materials disposed beneath the insulating surface layer, wherein the further area is positioned between and is spaced from each of the first and second contact areas;

wherein an inwardly-facing surface of each of the first and second contact areas and an inwardly-facing surface of the further area include an overlying layer of the second conductive type material, wherein the overlying layer of the second conductive type material has a thickness of about 1 µm or less and has a doping concentration of $10^{16}$ to $10^{17}$ atoms per cm$^3$; and an inner silicon dioxide insulating layer on a side of the overlying layer distal from the surface layer, the inner silicon dioxide insulating layer being effective with the overlying layer of the second conductive type material to thereby provide an increase in doping concentration of the overlying layer of the second conductive type material and provide a reduced size semiconductor element.

15. A semiconductor element according to claim 14, wherein the semiconductor element is a symmetrical structure having a line of symmetry that passes through the drain connector, with corresponding configured source, gate, and further areas on positioned on each side of the line of symmetry.

16. A semiconductor element according to claim 14, wherein the inner silicon dioxide insulating layer extends laterally outwardly of outermost electrical connections and is in contact with the insulating surface layer so that the overlying layer of the second conductive type material is enclosed between the insulating surface layer and the inner silicon dioxide insulating layer.

17. A semiconductor element having reduced dimensions, said semiconductor element comprising:

an insulating surface layer in which electric contact connections are provided, the connections being connected to respective first and second contact areas situated beneath the insulating surface layer and spaced from each other along an inwardly-facing surface of the insulating surface layer, wherein at least the first contact area is a first conductive type material and wherein the second contact area is a second conductive type material;

a further area formed by two layers of mutually different conductive type materials disposed beneath the insulating surface layer, wherein the further area is positioned between and is spaced from each of the first and second contact areas;

wherein an inwardly-facing surface of each of the first and second contact areas and an inwardly-facing surface of the further area include an overlying layer of the second conductive type material, wherein the overlying layer of the second conductive type material has a thickness of about 1 µm or less and has a doping concentration of $10^{16}$ to $10^{17}$ atoms per cm$^3$;

an inner silicon dioxide insulating layer on at least a side of the overlying layer distal from the surface layer, the inner silicon dioxide insulating layer being effective with the overlying layer of the second conductive type material to thereby provide an increase in doping concentration of the overlying layer of the second conductive type material and provide a reduced size semiconductor element; and an additional layer of conductive material between the overlying layer of the second conductive type material and the inner silicon dioxide insulating layer, wherein the additional layer overlies the inwardly-facing surfaces of the first and second contact areas and the further area.

18. A semiconductor element according to claim 17, wherein the semiconductor element is a symmetrical structure having a line of symmetry that passes through the drain connector, with corresponding configured source, gate, and further areas on positioned on each side of the line of symmetry.

19. A semiconductor element according to claim 17, wherein the inner silicon dioxide insulating layer extends laterally outwardly of an outermost electrical connection and is in contact with the insulating surface layer so that the overlying layer of the second conductive type material is enclosed between the insulating surface layer and the inner silicon dioxide insulating layer.

* * * * *